(12) United States Patent
Saitou

(10) Patent No.: US 9,929,526 B2
(45) Date of Patent: Mar. 27, 2018

(54) CONTACT TYPE POWER FEEDING APPARATUS

(71) Applicant: ULVAC, INC., Kanagawa (JP)

(72) Inventor: Shuuji Saitou, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 0 days.

(21) Appl. No.: 15/548,868

(22) PCT Filed: Jan. 8, 2016

(86) PCT No.: PCT/JP2016/000091
§ 371 (c)(1),
(2) Date: Aug. 4, 2017

(87) PCT Pub. No.: WO2016/132663
PCT Pub. Date: Aug. 25, 2016

(65) Prior Publication Data
US 2018/0048104 A1 Feb. 15, 2018

(30) Foreign Application Priority Data
Feb. 16, 2015 (JP) .................. 2015-027273

(51) Int. Cl.
*H01R 39/18* (2006.01)
*H01R 39/40* (2006.01)
(Continued)

(52) U.S. Cl.
CPC ......... *H01R 39/18* (2013.01); *C23C 14/3407* (2013.01); *H01R 39/40* (2013.01); *H01J 37/3405* (2013.01)

(58) Field of Classification Search
CPC .... H01R 39/18; H01R 39/40; C23C 14/3407; H01J 37/3405
See application file for complete search history.

(56) References Cited

U.S. PATENT DOCUMENTS 4,334,166 A * 6/1982 Miyahara .............. H02K 29/08
 310/268
4,885,496 A * 12/1989 Wheeler ................ H02K 3/38
 310/239
(Continued)

FOREIGN PATENT DOCUMENTS

JP 3974541 B2 9/2007
JP 2008-263775 A 10/2008
(Continued)

OTHER PUBLICATIONS

International Search Report for PCT Patent App. No. PCT/JP2016/000091 (dated Mar. 29, 2016).
(Continued)

*Primary Examiner* — Briggitte R Hammond
(74) *Attorney, Agent, or Firm* — Cermak Nakajima & McGowan LLP; Tomoko Nakajima

(57) ABSTRACT

There is provided a contact type power feeding apparatus in which, even if a brush Br disposed in a space between the axis body and the cylinder body that are disposed concentric with each other wears out as a result of sliding, contact can be surely secured between the brush and the axis body as well as the cylinder body, thereby efficiently causing electric current to flow between the two. A brush Br has first brush pieces each having an inner wall surface to make surface-contact with an outer peripheral surface of the axis body; and second brush pieces each having an outer wall surface to make a surface-contact with an inner peripheral surface of the cylinder body. The brush is constituted by alternately arranging, in the circumferential direction, the first brush pieces and the second brush pieces in a state of keeping them in surface-contact with each other. The side wall surfaces of the first brush pieces and the second brush pieces are respectively formed into a tapered shape which is inclined relative to the radial direction. Coil springs are disposed (Continued)

between the second brush pieces that are adjacent to each other, in order to give a biasing force in a direction to move the second brush pieces away from each other.

6 Claims, 4 Drawing Sheets

(51) Int. Cl.
 *C23C 14/34* (2006.01)
 *H01J 37/34* (2006.01)

(56) References Cited

U.S. PATENT DOCUMENTS

| | | | |
|---|---|---|---|
| 5,384,627 A * | 1/1995 | Behe | G03G 15/0803 399/291 |
| 9,349,576 B2 * | 5/2016 | Bernick | H01J 37/3405 |
| 2003/0173217 A1 | 9/2003 | Crowley | |
| 2004/0200733 A1 * | 10/2004 | Wadensweiler | B23H 5/08 205/672 |
| 2015/0019013 A1 * | 1/2015 | Rose | G01L 1/16 700/258 |
| 2016/0343550 A1 * | 11/2016 | Siegert | H01J 25/50 |

FOREIGN PATENT DOCUMENTS

| | | |
|---|---|---|
| JP | 2010-124526 A | 6/2010 |
| JP | 2014-143155 A | 8/2014 |

OTHER PUBLICATIONS

Notification of Transmittal of Translation of the International Preliminary Report on Patentability and English language version of International Preliminary Report on Patentability for PCT Patent App. No. PCT/JP2016/000091 (Aug. 31, 2017).

* cited by examiner

CONTACT TYPE POWER FEEDING APPARATUS

This application is a national phase entry under 35 U.S.C. § 371 of PCT Patent Application No. PCT/JP2016/000091, filed on Jan. 8, 2016, which claims priority under 35 U.S.C. § 119 to Japanese Patent Application No. 2015-027273, filed Feb. 16, 2015, both of which are incorporated by reference.

TECHNICAL FIELD

The present invention relates to a contact type power feeding apparatus.

BACKGROUND ART

This kind of contact type power feeding apparatus is known in, e.g., Patent Document 1. In this known apparatus, a power feeding apparatus is employed in inputting power to a cylindrical target in a rotary cathode unit for a magnetron sputtering apparatus. The power feeding apparatus is provided with: an inner cylinder body as a conductive axis body that is fixed to a predetermined position; an outer cylinder body (target) as a conductive cylinder body that is disposed coaxially in the circumference of this cylinder body; driving means for driving to rotate the outer cylinder body; and a brush which is disposed in a projecting manner on an outer peripheral surface of the inner cylinder body at a predetermined distance in an axial direction so that, as a result of rotation of the outer cylinder body, the inner peripheral surface of the outer cylinder body gets slid to thereby electrically conduct the two together.

In addition, an inlet port of a coolant is disposed in one end of the inner cylinder body and, also, an outlet port of the coolant is disposed on the other end on the inside of the outer cylinder body. It is thus so arranged that the coolant from the outlet port on the other end of the inner cylinder body is allowed to flow through the space between the inner cylinder body and the outer cylinder body, thereby flowing out of the coolant outlet port disposed in one end of the outer cylinder body. According to this arrangement, at the time of sputtering, not only can the target be cooled, but also can the dust and the like in the circulation passage be expelled from the coolant inlet port to the coolant outlet port.

In the above-mentioned kind of contact type power feeding apparatus, it is normal practice to select the material of the brush with respect to the material of the inner cylinder body and the outer cylinder body such that the brush preferentially wears. For this reason, the known apparatus has the following problems, namely, in an arrangement in which the brush is only disposed in a projecting manner on the inner cylinder body, when the contact surface of the brush with the outer cylinder body has worn out as a result of sliding movement of the brush, a problem arises in that the area of contact between the inner peripheral surface of the outer cylinder body with the brush becomes smaller. Or else, the inner peripheral surface of the outer cylinder body ceases to keep complete contact with the brush, resulting in failure to cause electric current to flow efficiently between the inner cylinder body and the outer cylinder body and, as a consequence, the lifetime of the apparatus in question comes to a premature termination. On the other hand, it is known to use, as a brush to be disposed between the inner cylinder body and the outer cylinder body, a coil material that has been formed into a spiral shape (see, for example, Patent Document 2). However, in this kind of arrangement it is difficult to secure the thickness in the radial direction of the brush itself, thereby resulting in a premature lifetime.

PRIOR ART DOCUMENT

Patent Document

Patent Document 1: Japanese Patent No. 3974541
Patent Document 2: JP-A-2014-143155

SUMMARY OF THE INVENTION

Problems that the Invention is to Solve

In view of the above points, this invention has a problem of providing a long-life contact type power feeding apparatus in which the contact of the brush with the axis body and with the cylinder body can surely be secured constantly even if the brush wears out, so that the electric current can flow efficiently between the axis body and the cylinder body.

Means of Solving the Problems

In order to solve the above problems, a contact type power feeding apparatus according to this invention comprises: a conductive axis body; a conductive cylinder body concentrically disposed in the circumference of the axis body; a brush disposed in a space between the axis body and the cylinder body so as to electrically conduct the axis body and the cylinder body while the axis body and the cylinder body rotate relative to each other. The brush is constituted by: first brush pieces having inner wall surfaces in surface-contact with an outer peripheral surface of the axis body; and second brush pieces having outer wall surfaces in surface-contact with an inner peripheral surface of the cylinder body such that the first brush pieces and the second brush pieces are disposed alternately in the circumferential direction in a state of being kept in surface-contact with one another. Side wall surfaces of the first brush pieces and of the second brush pieces are formed into a tapered shape inclined relative to one another in the radial direction. The contact type power feeding apparatus has biasing (urging) means disposed between at least the adjoining first brush pieces or the adjoining second brush pieces so as to give a biasing (urging) force to, and in a direction to move away from each other, the first brush pieces or the second brush pieces.

According to this invention, when the axis body and the cylinder body are rotated relative to the other, at least one of the first brush pieces and the second brush pieces come into sliding contact with the outer peripheral surface of the axis body or with the inner peripheral surface of the cylinder body depending on: the relative rotational speed of the axis body and the cylinder body; frictional resistance between the outer peripheral surface of the axis body and the first brush pieces; frictional resistance between the inner peripheral surface of the cylinder body and the second brush pieces; and the like. Accompanied by this sliding contact, the inner wall surfaces of the first brush pieces and the outer wall surfaces of the second brush pieces wear out, thereby giving rise to the occurrence of a clearance between the inner wall surfaces of the first brush pieces and the outer peripheral surfaces of the axis body, and between the outer wall surfaces of the second brush pieces and the inner peripheral surface of the cylinder body. In such a case, since those side surfaces of the first brush pieces and the second brush pieces which are in mutual surface-contact with each other are formed into a tapered shape, and since the mutually adjacent first brush pieces or the second brush pieces are biased, in case, for example, the second brush pieces are biased, the biased two pieces of the second brush pieces are, first, pushed in a direction away from each other so that the outer wall surfaces of the second brush pieces will come to be brought into surface-contact once again with the inner peripheral surface of the cylinder body. Accompanied by these movements, the first brush pieces that are respectively adjacent, in the circumferential direction, to these second brush pieces are respectively pushed radially inward so that the inner wall surfaces thereof come to be once again brought into surface-contact with the outer peripheral surface of the axis body. In a manner similar to this, the remaining second brush pieces are pushed radially outward and the remaining first brush pieces are pushed radially inward. In this manner, all of the first brush pieces and the second brush pieces respectively come to be in surface-contact with the inner peripheral surface of the cylinder body and with the outer peripheral surface of the axis body.

In this manner, according to this invention, even if the first brush pieces and the second brush pieces are worn out, the contact between the axis body and the cylinder body is always secured. While the axis body and the cylinder body are rotated relative to each other, electric current can be caused to flow efficiently between the axis body and the cylinder body. In addition, as long as the biasing force of the biasing means operates within the range of the radial thickness of the first brush pieces and the second brush pieces, the contact of the brushes with the axis body and with the cylinder body can be surely secured. Therefore, the lifetime of the contact type power feeding apparatus can be prolonged.

By the way, when at least one of the first brush pieces and the second brush pieces move in sliding with the outer peripheral surface of the axis body or with the inner peripheral surface of the cylinder body, wear dust will be generated and, as a consequence, a smooth relative rotation between the axis body and the cylinder body may be hindered. As a solution, in this invention, in case the axis body is cylindrical, there may be employed an arrangement in which: a space is provided between the outer wall surfaces of the first brush pieces and the inner wall surface of the cylinder body; and a space is provided between the inner wall surfaces of the second brush pieces and the outer wall surface of the axis body, respectively. In a passage to allow for flow of a fluid is defined between the outer wall surfaces of the first brush pieces and those side wall surfaces of the second brush pieces which extend radially outward from the outer wall surfaces, and between the inner wall surfaces of the second brush pieces and those side wall surfaces of the first brush pieces which extends radially inward. According to this arrangement, depending on the use of the contact type power feeding apparatus of this invention, while the axis body and the cylinder body are rotated relative to each other, a liquid such as the cooling water, the operating fluid having the insulating characteristics, and the like can be circulated from inside the axis body through the space between the axis body and the cylinder body. Then, the wear dust can be removed by the liquid that flows through the fluid passage. Further, in case the operating fluid is circulated, the wear on the first brush pieces and the second brush pieces can be reduced, thereby contributing to the prolonged lifetime of the apparatus.

Further, preferably, the first brush pieces have the outer wall surfaces that curve in an arcuate shape coaxial with the inner wall surfaces, and the second brush pieces shall preferably have the inner wall surfaces that curve in an arcuate shape coaxial with the outer wall surfaces. According to this arrangement, the thickness, in the radial direction, of the first brush pieces and the second brush pieces can be secured to the maximum extent possible. In this manner, the amount that is allowed to be worn out increases, thereby further prolonging the lifetime of the apparatus.

By the way, in this invention, preferably the above-mentioned biasing means is a coil spring disposed in a compressed manner in a space between the side wall surfaces of the first brush pieces or between the side wall surfaces of the second bush pieces, and preferably a plurality of coil springs are disposed at a predetermined distance from one another in the axial direction.

MODES FOR CARRYING OUT THE INVENTION

With reference to the drawings, a description will now be made of an embodiment of a contact type power feeding apparatus of this invention on condition that an axis body and a cylinder body are an inner cylinder body and an outer cylinder body, both being constituted by an electrically conductive material such as metal and the like.

Figure 1:
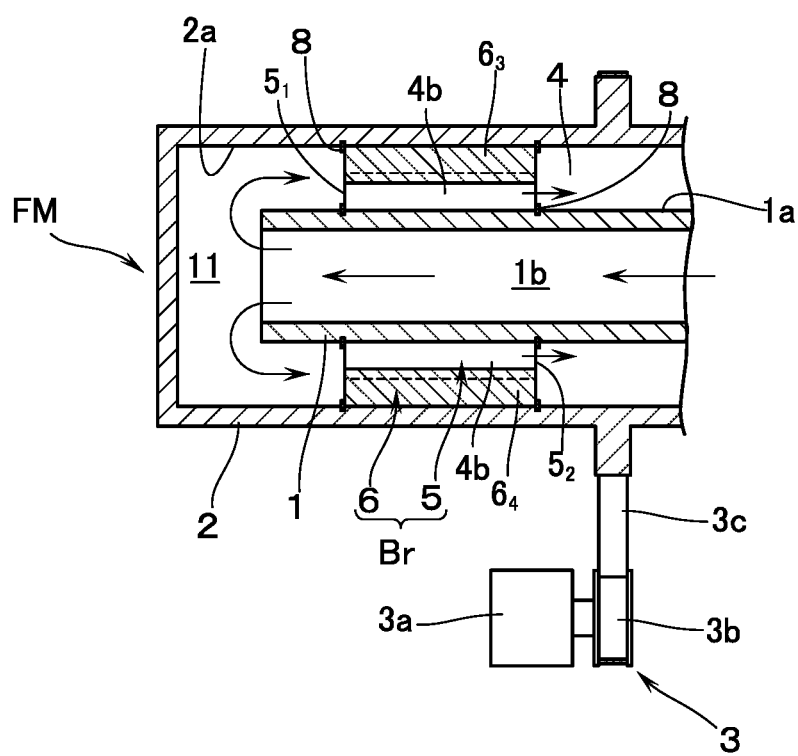
FIG. 1 is a sectional view, partly omitted, of the power feeding apparatus according to an embodiment of this invention.
Figure 2:
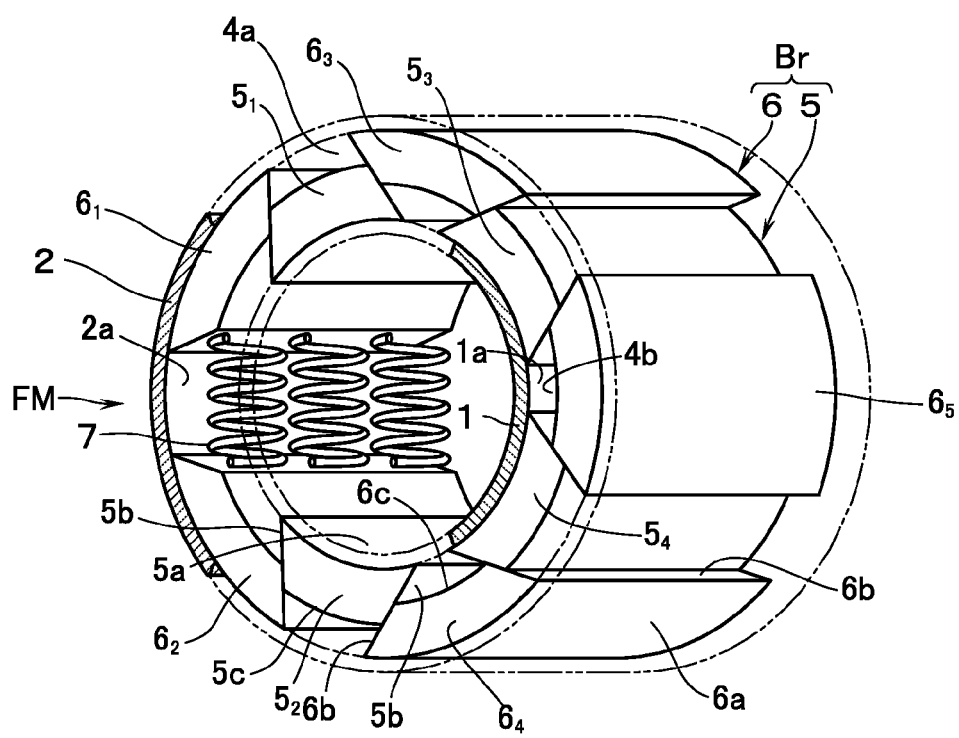
FIG. 2 is a perspective view showing, in enlargement, an essential portion of the power feeding apparatus shown in FIG. 1.

With reference to FIG. 1 and FIG. 2, a reference mark FM designates a contact type power feeding apparatus according to this embodiment. The contact type power feeding apparatus FM is provided with: an inner cylinder body 1 which is circular in section; an outer cylinder body 2 which is disposed around the periphery of the inner cylinder body 1 in a concentric relationship with each other and which is circular in section with one end (left end in FIG. 1) being closed; a driving means 3 for driving to rotate the outer cylinder body 2; and a brush Br which is disposed in a space 4 between the inner cylinder body 1 and the outer cylinder body 2 so as to bring the inner cylinder body 1 and the outer cylinder body 2 into electrical conduction with each other. As the driving means 3, there is no particular limitation as long as the outer cylinder body 2 can be rotated relative to the inner cylinder body 1. It may, for example, be constituted by a motor $3a$; a pulley $3b$ which is provided on a driving shaft of the motor $3a$; and a belt $3c$ which is wound around an outer peripheral surface of the outer cylinder body 2.

The brush Br is made of a material that is ground in priority as compared with the material of the inner cylinder body 1 and of the outer cylinder body 2, and is constituted by first brush pieces 5 and second brush pieces 6. The first brush pieces 5 and the second brush pieces 6 may be manufactured, for example, in the following manner. That is, a cylindrical member (not illustrated) that has a plate thickness equivalent to the radial length between the inner cylinder body 1 and the outer cylinder body 2 and that can be interposed into the space 4 is divided into a plurality of arcuate segments at a substantially equal distance from one another in the radial direction (10 segments in this embodiment). At this time, by alternately inclining the surfaces of the divided segments in different directions relative to the radial direction (vertical or up-and-down direction as seen in FIG. 1), the segments are grouped into two: one group of arcuate segments having divided surfaces in a tapered shape that becomes smaller toward radially outward, each of these arcuate segments being defined as a first brush piece 5; and the other group of arcuate segments having divided surfaces in an inclined shape that becomes larger toward radially outward, each of these arcuate segments being defined as a second brush piece 6. According to this arrangement, the first brush pieces 5 have inner wall surfaces 5$a$ which are in surface-contact with the outer peripheral surface 1$a$ of the inner cylinder body 1, and also the second brush pieces 6 have outer wall surfaces 6$a$ which are in surface-contact with the inner peripheral surface 2$a$ of the outer cylinder body 2. Side surfaces 5$b$, 6$b$ which serve as parting surfaces of the first brush pieces 5 and the second brush pieces 6, respectively, are formed in a tapered shape inclining relative to the radial direction so as to come into surface-contact with each other.

Further, in order to secure a space 4$a$ between the outer wall surfaces 5$c$ of the first brush pieces 5 and the inner peripheral surface 2$a$ of the outer cylinder body 2 in a state in which the first brush pieces 5 and the second brush pieces 6 have been inserted in position into the space 4, the outer wall surfaces 5$c$ of the first brush pieces 5 were cut along a concentric arc of the above-mentioned cylinder body. Also, in order to secure a space 4$b$ between the inner wall surfaces 6$c$ of the second brush pieces 6 and the outer peripheral surface 1$a$ of the inner cylinder body 1, the inner wall surfaces 6$c$ of the second brush pieces 6 were cut along a concentric arc of the cylinder body. According to this arrangement, the first brush pieces 5 have the outer wall surfaces 5$c$ that are curved into an arc concentric with the inner wall surface 5$a$, and the second brush pieces 6 have the inner wall surfaces 6$c$ that are curved into an arc concentric with the outer wall surfaces 6$a$. Then, fluid passages 4$a$, 4$b$ are defined by the outer wall surfaces 5$c$ of the first brush pieces 5 and those side wall surfaces 6$b$, 6$b$ of the second brush pieces 6 which are extended from the outer wall surfaces 5$c$ in the diametrically outward direction, and also fluid passages 4$a$, 4$b$ to allow for the passage of liquid are defined by the inner wall surfaces 6$c$ of the second brush pieces 6 and those side wall surfaces 5$b$, 5$b$ of the first brush pieces 5 which are extended from the inner wall surfaces 6$c$ in the diametrically inward direction.

Further, when the first brush pieces 5 and the second brush pieces 6 are inserted into the space 4, one 5 of the first brush pieces is omitted and the second brush pieces 6 on both sides of this omitted first brush pieces 5 are defined as second brush pieces 6$_1$, 6$_2$. Between the side surfaces 6$b$ of the circumferentially adjacent second brush pieces 6$_1$, 6$_2$, there is disposed, in a compressed state, a coil spring 7 as biasing means to apply a biasing force to the second brush pieces 6$_1$, 6$_2$ in the direction away from each other. In this case, three coil springs 7 having the same spring constant are disposed in the axial direction at an equal distance from one another. By the way, there may be provided projecting pieces 8 which project in the radial direction from the outer peripheral surface 1$a$ of the inner cylinder body 1 or from the inner peripheral surface 2$a$ of the outer cylinder body 2 so that the first brush pieces 5 and the second brush pieces 6 can be held in an aligned manner. Furthermore, the coil spring 7 may be provided with known mechanisms to prevent the deflection and buckling, where necessary.

According to the above arrangement, when the motor 3$a$ is driven for rotation to thereby rotate the outer cylinder body 2, the outer cylinder body 2 makes a relative rotation with respect to the inner cylinder body 1. At this time, depending on the relative rotational speed of the outer cylinder body 2; friction resistance between the outer peripheral surface 1$a$ of the inner cylinder body 1 and the first brush pieces 5; friction resistance between the inner peripheral surface 2$a$ of the outer cylinder body 2 and the second brush pieces 6; and the like, at least one of the first brush pieces 5 and the second brush pieces 6 moves in sliding contact with the outer peripheral surface 1$a$ of the inner cylinder body 1 or the inner peripheral surface 2$a$ of the outer cylinder body 2. Accompanied by this sliding movement, the inner wall surfaces 5$a$ of the first brush pieces 5 and the outer wall surfaces 6$a$ of the second brush pieces 6 will wear out. As a result, there will arise a clearance between the inner wall surfaces 5$a$ of the first brush pieces 5 and between the outer wall surface 1$a$ of the inner cylinder body 1 and between the outer wall surfaces 6$a$ of the second brush pieces 6 and the inner peripheral surface 2$a$ of the outer cylinder body 2. Now, since those side wall surfaces 5$a$, 5$b$ of the first brush pieces 5 and the second brush pieces 6 which come into surface-contact with each other have been formed into a tapered shape, and since the second brush pieces 6 are biased by the coil springs 7, the second brush pieces 6$_1$, 6$_2$ are pushed by the coil springs 7, the outer wall surfaces 6$a$ of the second brush pieces 6 will come into 6$_1$, 6$_2$ first pushed in a direction in which the second brush pieces 6$_1$, 6$_2$ are forced away from each other. As a result, the outer wall surfaces 6$a$ of the respective second brush pieces 6$_1$, 6$_2$ will come once again into surface-contact the inner circumferential surface 2$a$ of the outer cylinder body 2. Suppose that the first brush pieces 5 that lie circumferentially adjacent to both the second brush pieces 6$_1$, 6$_2$ are defined as the first brush pieces s 5$_1$, 5$_2$. Then, accompanied by the above movements, the first brush pieces s 5$_1$, 5$_2$ are respectively pushed radially inward so that the inner wall surfaces 5$a$ of the first brush pieces s 5$_1$, 5$_2$ come to be brought into surface-contact once again with the outer peripheral surface 1$a$ of the inner cylinder body 1. In a manner similar to the above, the remaining second brush pieces 6$_3$~6$_6$ are pushed radially outward, and the remaining first brush pieces 5$_3$, 5$_6$ are pushed radially inward. All of the first brush pieces 5 and the second brush pieces 6 will thus make surface-contact with the inner peripheral surface 2$a$ of the outer cylinder body 2 and with the outer peripheral surface 1$a$ of the inner cylinder body 1.

Accordingly, even if the first brush pieces 5 or the second brush pieces 6 get worn out due to sliding, the contact between the inner cylinder body 1 and the outer cylinder body 2 can surely be secured. While the inner cylinder body 1 and the outer cylinder body 2 are rotated relative to each other, electric current can be made to flow efficiently between the inner cylinder body 1 and the outer cylinder body 2. In addition, as long as the biasing force of the coil springs 7 can be operated within a range of thickness, in the radial direction, of the first brush pieces 5 and the second brush pieces 6, the contact of the brush Br with the inner cylinder body 1 and with the outer cylinder body 2 can surely be secured. Therefore, the lifetime of the power feeding apparatus can be prolonged. In this case, except for the range in which one piece of the first brush piece 5 has been omitted in order to dispose the coil springs 7, instead, the outer wall surfaces 6$a$ of the second brush pieces 6$_1$, 6$_2$ come into surface-contact with the inner peripheral surface 2$a$ of the outer cylinder body 2, and also the inner wall surfaces 5a of the first brush pieces 5₁, 5₂ are in surface-contact with the outer peripheral surface 1a of the inner cylinder body 1. Therefore, as compared with the brush of the conventional example, a large contact surface can be secured and is advantageous in case a large HF current is caused to flow. In addition, as compared with the brushes of the conventional examples, the axial length can be made shorter when the contact area of the brush with the outer peripheral surface of the inner cylinder body and the inner peripheral surface of the outer cylinder body is designed to be identical. It can thus contribute to the downsizing of the apparatus when the power feeding apparatus according to this invention is to be applied.

Further, since the fluid passages 4a, 4b to allow for the passage of a fluid have been defined, depending on the purpose of the power feeding apparatus FM, liquids such as a coolant like cooling water or an operating oil having electrically insulating characteristics, can be circulated in order to clear the powder with wearing characteristics by means of the liquid that flows through the space 4 or the fluid passages 4a, 4b. Still furthermore, the heat generated by power supplying can also be removed. Furthermore, in case the operating oil is used, wear of the first brush pieces 5 and the second brush pieces 6 can be reduced, thereby obtaining a longer lifetime. In case a liquid is circulated, preferably a filter shall be disposed in the liquid circulation passage to clear the liquid of the powder having wearing characteristics. In addition, since an arrangement has been made that the first brush pieces 5a have each the outer wall surface 5c which curves into an arcuate shape coaxial with the inner wall surface 5a, and that the second brush pieces 6 have each the inner wall surface 6c which curves into an arcuate shape coaxial with the outer wall surface 6a, the thicknesses in the radial direction of the first brush pieces 5 and of the second brush pieces 6 can be secured to the maximum extent possible. The amount of allowable wear can thus be increased, whereby the lifetime of the power feeding apparatus can be prolonged.

A description has so far been made of an embodiment of this invention, but this invention shall not be limited to the above. In the above embodiment, a description has been made of an example in which the axis body is made to be an inner cylinder body 1, but a solid member may also be used. In addition, a description has been made of an example in which the outer cylinder body 2 is driven for rotation. This invention can, however, be applicable to a case in which, not only the outer cylinder body 2, but also both the inner cylinder body 1 and the outer cylinder body 2 are driven for rotation. In addition, in the above-mentioned embodiment, only the example in which electric conduction is made only between the inner cylinder body 1 and the outer cylinder body 2 through the brushes Br. This invention, however, shall not be limited to the above, but may be applicable to, e.g., a multi-pole type power feeding apparatus. In this case, for example, the axis body and the cylinder body shall be arranged to be a plurality of segments that are sectioned in the axial direction with the necessary insulation distance in between. The above-mentioned brushes Br may then be inserted between respectively segmented axis bodies and cylinder bodies.

Further, the shape of the first brush pieces 5 and the second brush pieces 6 need not be limited to the above-mentioned example as long as they are provided with: wall surfaces 5a, 6a which respectively come into surface-contact with the outer peripheral surface 1a of the inner cylinder body 1 and the inner peripheral surface 2b of the outer cylinder body 2; and the side wall surfaces 5b, 6b which are mutually in surface-contact with each other. Further, a description has been made of an example in which fluid passages 4a, 4b are defined by cutting (machining) the outer wall surfaces 5c of the first brush pieces 5 and the inner wall surfaces 6c of the second brush pieces 6. It is, however, possible to form through-going holes which pass through the brush pieces 5, 6 in the axial direction, thereby making them to serve as fluid passages. In addition, although not illustrated in particular, the following arrangement may also be made to circulate the liquid inside the power feeding apparatus FM, thereby omitting the pump for circulating the liquid. In concrete, for example, on an inner peripheral surface of the outer cylinder body 2, radially recessed groove portion is formed spirally along the entire length of the outer cylinder body 2. When the outer cylinder body 2 is rotated, the liquid that exists in the space 4 between the inner cylinder body 1 and the outer cylinder body 2 is thus arranged to be transferred. Further, a description has been made of an example in which the biasing means is disposed between the second brush pieces 6. It is, however, also possible to dispose the biasing means between the first brush pieces 5. In addition, although a description has been made of an example in which coil springs 7 were used as the biasing means, this invention shall not be limited to the above.

Figure 3:
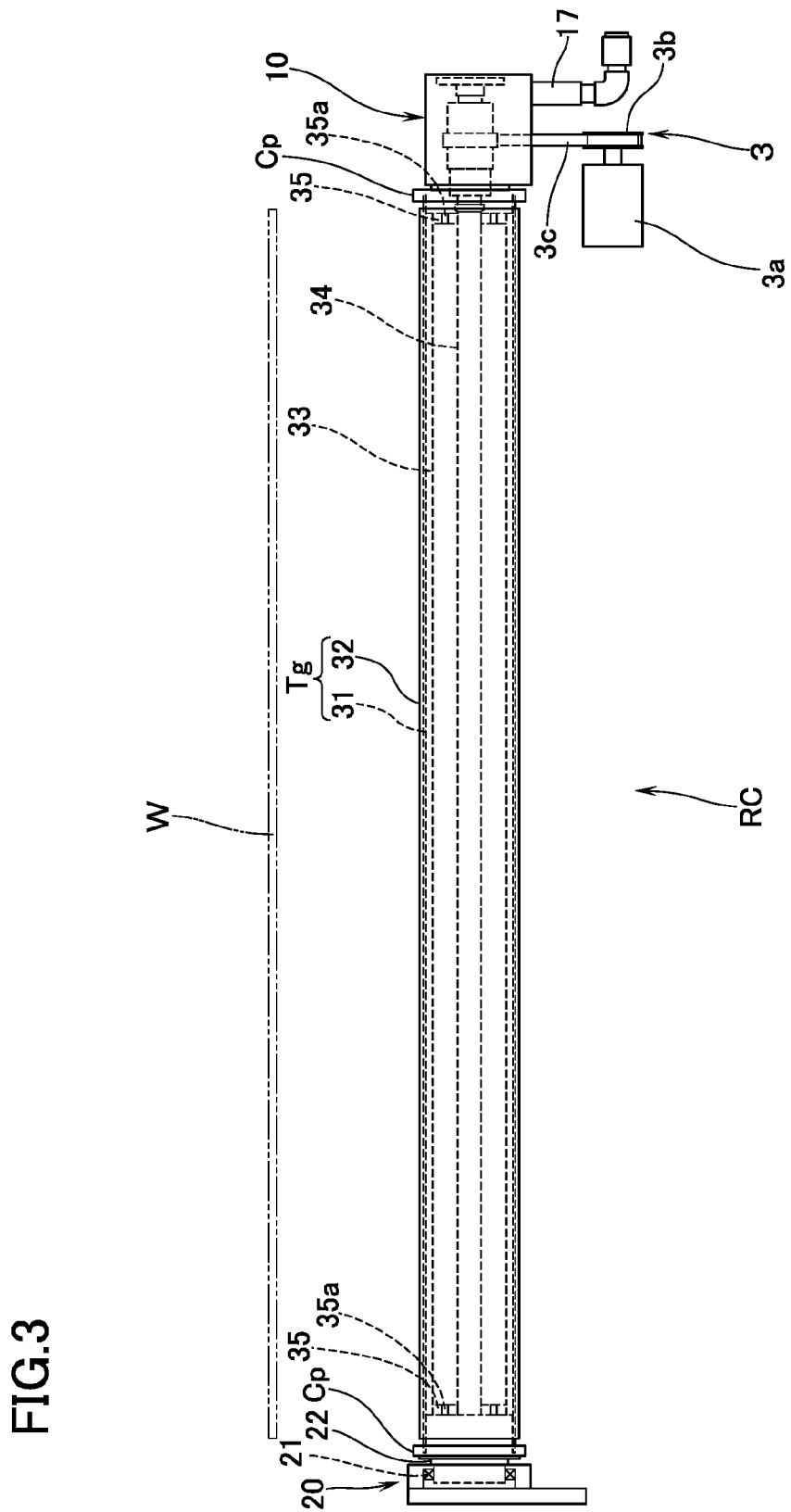
FIG. 3 is a front view of a rotary cathode unit for a sputtering apparatus to which the power feeding apparatus of this invention is applied.

A description will now be made of an example in which the contact type power feeding apparatus of the above-mentioned embodiment was applied to a rotary cathode unit for a sputtering apparatus. In the following description, the terms showing the directions such as "upper", "lower", "right" and "left" shall be used based on the posture of the rotary cathode unit as shown in FIG. 3. Further, the parts constituting the power feeding apparatus of the above-mentioned embodiment are given the same reference marks.

Figure 4:
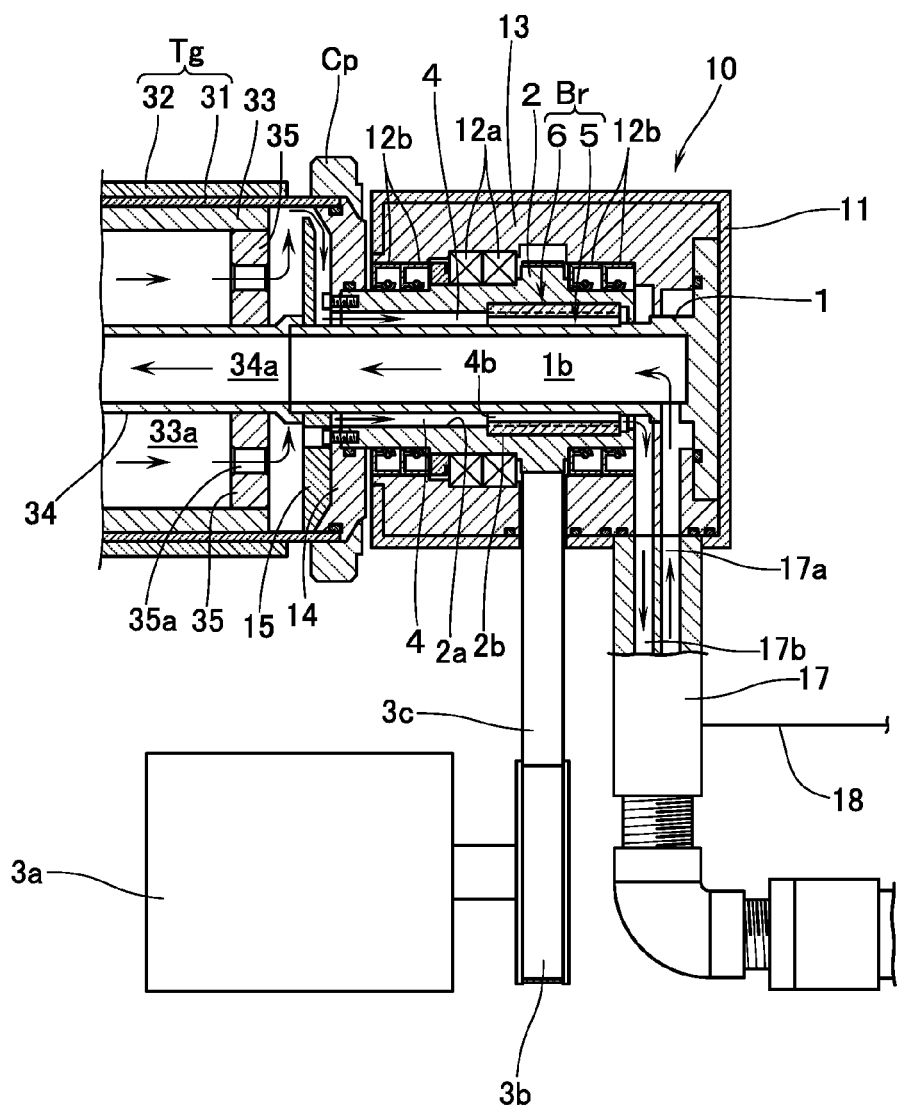
FIG. 4 is a sectional view, partly shown in section, of an essential portion of the rotary cathode unit.

With reference to FIG. 3 and FIG. 4, the rotary cathode unit RC is disposed inside a vacuum chamber (not illustrated) through an electrically insulating matter so as to lie opposite to a substrate W which is an object to which a film is formed. The rotary cathode unit is constituted by: a target Tg in a cylindrical shape; a driving block 10 which is coupled to the right end of the target Tg through a clamp Cp; and a supporting block 20 which is coupled to the left end of the target Tg through a clamp Cp. The supporting block 20 is provided with a driven shaft 22 supported by a bearing 21 so as to rotatably support one end of the target Tg. The target Tg is made up of: a cylindrical backing tube 31; and a cylindrical target material 32 that is coupled to the backing tube 31 through a bonding material (not illustrated) such as indium, tin, and the like. As the target material 32, there may be used a material appropriately selected from a metal or a metallic compound depending on the composition of the film to be formed on the substrate W.

The backing tube 31 is inserted onto an outside of an outer tube 33 that is elongated over a substantially entire length in the right-to-left direction, i.e., an axial direction of the target Tg. Inside the outer tube 33 there is concentrically disposed an inner tube 34. An opening on each of the ends of the right-to-left direction is respectively closed by a cap body 35, and the cap body 35 has formed therethrough a through hole 35a in the axial direction. The inner space of the inner tube 34 constitutes a feed passage 34a in circulating the coolant such as cooling water, and the space between the inner tube 34 and the outer tube 33 constitutes a return passage 33a. Although not particularly explained with illustrations, the following arrangement may also be employed: i.e., when a magnet unit of a known construction is built into the space between the inner tube 34 and the outer tube 33, and the target material 32 is sputtered by applying predetermined electric potential to the target Tg, the leakage flux may be arranged to be generated, between the target Tg and the substrate W, such that a line passing through the position in which the vertical component of the magnetic field becomes zero, is extended over the entire length, in the axial direction, of the target material 32 to thereby close in a racetrack shape.

The driving block 10 has a housing 11, and on the right inner wall of the housing 11, there is vertically disposed the inner cylinder body 1 which extends in the right-and-left direction. The left end of the inner cylinder body 1 is coupled, in a fluid-tight manner, to the inner tube 34. In the circumference of the inner cylinder body 1 that is fixed to the housing 11, there is disposed an outer cylinder body 2 which is coaxial with this inner cylinder body 1. In the inner circumference surface 2a of the outer cylinder body 2, there is disposed an annular recessed portion 2b which is dented in the radial direction. This dented portion 2b has mounted by fitting therein the second brush pieces 6 of the brush Br. In this case, only the fluid passage 4b can allow for passage of the coolant, the fluid passage being defined by the outer wall surface 5c of the first brush pieces 5 and those side wall surfaces 6b, 6b of the second brush pieces 5 which extend radially outward from the outer wall surface 5c.

The outer cylinder body 2 is rotatably supported by the supporting member 13 that is inserted into the inside of housing 11 through a plurality of bearings 12a. The outer cylinder body 2 has an oil seal 12b that is inserted onto an outside thereof, positioned at both the left and right sides of the bearing 12a. In addition, in the outer peripheral surface 2a of the outer cylinder body 2, a belt 3c is wound between a pulley 3b that is attached to the drive shaft of the motor 3a. Further, on the left end of the outer cylinder body 2, a conductive flange 14 is mounted in a fluid-tight manner. By means of a clamp Cp through this flange 14, the outer cylinder body 2 is coupled to the backing tube 31. According to this arrangement, when the motor 3a is driven to rotate the outer cylinder body 2, the target Tg is driven for rotation integral with the outer cylinder body 2 at a predetermined rotational speed. In this case, the inner cylinder body 1 is in communication with the outer cylinder body 2 through the brush Br, and this outer cylinder body 2 is in communication with the backing tube 31 through the flange 14, and further with the target material 32 (in other words, the inner cylinder body 1 and the target material 32 become the same potential). In that portion of the inner cylinder body 1 which protrudes to the left side from the outer cylinder body 2, there is inserted a guide plate 15 which guides the coolant from the return passage 33a into the communication passage 4 between the inner cylinder body 1 and the outer cylinder body 2.

The housing 11 is provided with a feed passage 17a and a return passage 17b, respectively, and is provided with a conductive tube 17 whose front end is coupled to the inner cylinder body 1. In this arrangement, the feed passage 17a is in communication with the inner space 1b of the inner cylinder body 1b, and the return passage 17b is in communication with the space 4 between the inner cylinder body 1 and the outer cylinder body 2. According to this arrangement, there is formed a coolant circulation passage that is communicated from the feed passage 17a of the tube 17 through the inner space 1b of the inner cylinder body 1 into communication with the return passage 34a inside the inner tube 34, and from a through hole 35a in the cap body 35 on the left side through the through hole 35a into communication with the space 41 between the inner cylinder body 1 and the outer cylinder body 2, thereby passing through the communication passage 4a back to the return passage 17b. In this manner, the target material 32 can be cooled, during sputtering, through heat exchanging with the coolant. Further, the tube 17 has connected thereto an output cable 18 from a sputtering power (not illustrated). According to this arrangement, while the outer cylinder body 2 is driven for rotation by the motor 3a, and while the target Tg is being driven for rotation, power, e.g., with negative potential, can be applied to the target material 32 through the output cable 18 from the sputtering power.

EXPLANATION OF REFERENCE CHARACTERS

FM contact type power feeding apparatus, inner cylinder body (axis body)
1 inner cylinder body (axis body)
1a outer peripheral surface
2 outer cylinder body (cylinder body)
2a inner peripheral surface
4 space between inner cylinder body and outer cylinder body
4a, 4b fluid passage between brush pieces
Br brush
5 first brush pieces
5a inner wall surface
5b side wall surface
5c outer wall surface
6 second brush pieces
6a outer wall surface
6b side wall surface
6c inner wall surface
7 coil spring (biasing means)

The invention claimed is:
1. A contact type power feeding apparatus comprising:
a conductive axis body;
a conductive cylinder body concentrically disposed in the circumference of the axis body;
a brush disposed in a space between the axis body and the cylinder body so as to electrically conduct the axis body and the cylinder body while the axis body and the cylinder body rotate relative to each other;
wherein the brush is constituted by: first brush pieces having inner wall surfaces in surface-contact with an outer peripheral surface of the axis body; and second brush pieces having an outer wall surface in surface-contact with an inner peripheral surface of the cylinder body such that the first brush pieces and the second brush pieces are disposed alternately in the circumferential direction in a state of being kept in surface-contact with one another;
wherein the side wall surfaces of the first brush pieces and of the second brush pieces are formed into a tapered shape inclined relative to one another in the radial direction; and
biasing means disposed between at least the adjoining first brush pieces or the adjoining second brush pieces so as to give a biasing force to, and in a direction to move away from each other, the first brush pieces or the second brush pieces.
2. The contact type power feeding apparatus according to claim 1 in which the axis body is cylindrical,
wherein a space is provided between the outer wall surfaces of the first brush pieces and the inner wall surface of the cylinder body, and a space is provided between the inner wall surface of the second brush pieces and the outer wall surface of the axis body, respectively, and wherein a passage to allow for flow of a fluid is defined between the outer wall surfaces of the first brush pieces and those side wall surfaces of the second brush pieces which extend radially outward beyond the outer wall surfaces of the first brush pieces, and between the inner wall surfaces of the second brush pieces and those side wall surfaces of the first brush pieces which extend radially inward beyond the inner wall surfaces of the first brush pieces.

3. The contact type power feeding apparatus according to claim 2, wherein the first brush pieces have the outer wall surfaces that curve in an arcuate shape coaxial with the inner wall surfaces, and wherein the second brush pieces have the inner wall surfaces that curve in an arcuate shape coaxial with the outer wall surfaces.

4. The contact type power feeding apparatus according to claim 1, wherein the biasing means is a coil spring disposed in a compressed manner in a space between the side wall surfaces of the first brush pieces or between the side wall surfaces of the second bush pieces, and wherein a plurality of coil springs are disposed at a predetermined distance from one another in the axial direction.

5. The contact type power feeding apparatus according to claim 2, wherein the biasing means is a coil spring disposed in a compressed manner in a space between the side wall surfaces of the first brush pieces or between the side wall surfaces of the second bush pieces, and wherein a plurality of coil springs are disposed at a predetermined distance from one another in the axial direction.

6. The contact type power feeding apparatus according to claim 3, wherein the biasing means is a coil spring disposed in a compressed manner in a space between the side wall surfaces of the first brush pieces or between the side wall surfaces of the second bush pieces, and wherein a plurality of coil springs are disposed at a predetermined distance from one another in the axial direction.

* * * * *